United States Patent
Liang et al.

(10) Patent No.: US 9,543,362 B2
(45) Date of Patent: Jan. 10, 2017

(54) PROTECTIVE LAYER(S) IN ORGANIC IMAGE SENSORS

(71) Applicant: Taiwan Semiconductor Manufacturing Co., Ltd., Hsin-Chu (TW)

(72) Inventors: Chin-Wei Liang, Zhubei (TW); Cheng-Yuan Tsai, Chu-Pei (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/929,795

(22) Filed: Nov. 2, 2015

(65) Prior Publication Data

US 2016/0056212 A1    Feb. 25, 2016

Related U.S. Application Data

(63) Continuation of application No. 14/316,946, filed on Jun. 27, 2014, now Pat. No. 9,219,240.

(51) Int. Cl.
*H01L 29/08* (2006.01)
*H01L 31/00* (2006.01)
(Continued)

(52) U.S. Cl.
CPC .......... *H01L 27/307* (2013.01); *H01L 27/302* (2013.01); *H01L 27/322* (2013.01);
(Continued)

(58) Field of Classification Search
CPC ..... H01L 27/302; H01L 27/322; H01L 51/447
(Continued)

(56) References Cited

U.S. PATENT DOCUMENTS 8,053,661 B2  11/2011  Mitsui et al.
2007/0108539 A1*  5/2007  Brabec ............... B82Y 10/00
                                            257/414
(Continued)

OTHER PUBLICATIONS

Mikio Ihama, et al.; "Organic CMOS Image Sensor with Thin Panchromatic Organic Photoelectric Conversion Layer: Durability and Performance"; Frontier Core-Technology Laboratories, FUJIFILM Corporation; Sep. 30, 2013; p. 1-4.
(Continued)

*Primary Examiner* — David Vu
*Assistant Examiner* — Brandon Fox
(74) *Attorney, Agent, or Firm* — Eschweiler & Associates, LLC

(57) ABSTRACT

The present disclosure relates to an organic image sensor and an associated method. By inserting an inorganic protective layer between an electrode and an organic photo active region of the image sensor, the organic photo active region is protected from moisture, oxygen or following process damage. The inorganic protective layers also help to suppress the leakage in the dark. In some embodiments, the organic image sensor comprises a first electrode, an organic photoelectrical conversion structure disposed over the first electrode and a second electrode disposed over the organic photoelectrical conversion structure. The organic image sensor further comprises a first protective structure covering a top surface and a sidewall of the organic photoelectrical conversion structure.

20 Claims, 6 Drawing Sheets

(51) Int. Cl.
*H01L 27/30* (2006.01)
*H01L 51/44* (2006.01)
*H01L 51/00* (2006.01)
*H01L 27/32* (2006.01)

(52) U.S. Cl.
CPC ........ *H01L 51/0017* (2013.01); *H01L 51/442* (2013.01); *H01L 51/447* (2013.01); *H01L 51/448* (2013.01); *H01L 2251/306* (2013.01); *H01L 2251/308* (2013.01); *Y02E 10/549* (2013.01)

(58) Field of Classification Search
USPC .............................. 257/40; 250/200; 136/263
See application file for complete search history.

(56) References Cited

U.S. PATENT DOCUMENTS

| | | |
|---|---|---|
| 2012/0241003 A1 | 9/2012 | Wachi et al. |
| 2014/0158859 A1* | 6/2014 | Fukuzaki ............ H01L 51/0056 250/200 |
| 2014/0231781 A1* | 8/2014 | Imai ..................... H01L 51/448 257/40 |

OTHER PUBLICATIONS

Notice of Allowance dated Aug. 20, 2015 for U.S. Appl. No. 14/316,946.

* cited by examiner

PROTECTIVE LAYER(S) IN ORGANIC IMAGE SENSORS

REFERENCE TO RELATED APPLICATION

This Application is a Continuation of U.S. application Ser. No. 14/316,946 filed on Jun. 27, 2014, the contents of which are incorporated by reference in their entirety.

BACKGROUND

Digital cameras and other digital imaging devices use arrays of millions of tiny photodetectors or pixels to record an image. For example, when a cameraman or camerawoman presses his or her camera's shutter button and exposure begins, each photodetector in the array is uncovered to detect the presence or absence of photons at the individual array locations. To end the exposure, the camera closes its shutter, and circuitry in the camera assesses how much light (e.g., how many photons) fell into each photodetector while the shutter was open. The relative quantity or intensity of photons that struck each photodetector are then stored according to a bit depth (0-255 for an 8-bit pixel). The digital values for all the pixels are then stored and are used to form a resultant image.

Conventional solid state image sensors are made up of an array of photodetectors which individually include PN junctions made of semiconductor material, for example, silicon disposed in a semiconductor substrate. Color filter arrays (CFAs) with separate color filters for red, blue, and green light are often arranged over photodetector arrays to differentiate between different colors of light. When an incident light ray has a large angle of incidence, the light can easily pass through one color filter into other neighboring color filters and/or other neighboring photodetectors underneath the color filters. Thus, a shield or re-direct element is inserted between photodetectors of different colors to reduce the crosstalk between photodetectors of different color filters, which otherwise will ultimately cause noise that distorts the resultant digital images.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
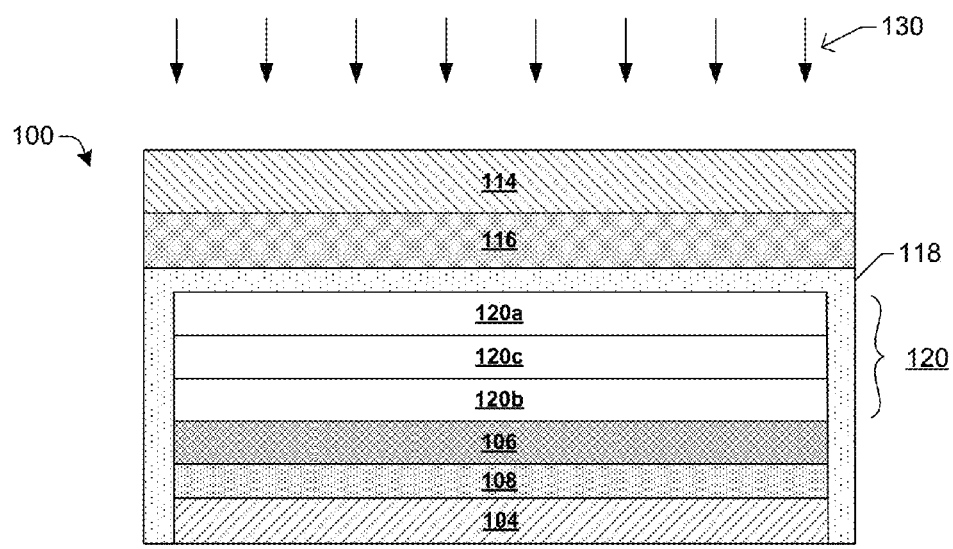
FIG. 1A illustrates a cross-sectional view of some embodiments of an organic image sensor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One type of solid state image sensor is an organic CMOS image sensor (CIS) that includes an organic photoelectrical conversion structure arranged between upper and lower electrodes. When incident radiation of sufficient energy strikes the organic photoelectrical conversion structure, an electron-hole pair is created. Due to a bias applied across the electrodes, the hole is accelerated toward one of the electrodes (e.g., towards the lower electrode acting as an anode), while the electron is accelerated toward the other electrode (e.g., towards the upper electrode acting as a cathode). In this way, the incident radiation produces a photocurrent between the electrodes, wherein the current level of this photocurrent is proportional to the intensity of the incident radiation absorbed.

To help decrease leakage, some organic CISs include electron-blocking and/or hole-blocking layers between the organic photoelectrical conversion structure and the various electrodes. For example, a hole-blocking layer can be inserted between the organic photoelectrical conversion structure and the cathode (e.g., upper electrode) to hinder holes moving from the cathode to the organic photoelectrical conversion structure. Similarly, an electron-blocking layer can be inserted between the organic photoelectrical conversion structure and the anode (e.g., lower electrode) to hinder electrons moving from the anode to the organic photoelectrical conversion structure. Thus, these electron/hole blocking layers can help to decrease leakage and improve efficiency of the cell. Unfortunately, in previous approaches, an electron- or hole-blocking layer is formed directly over an exposed surface of the organic photoelectrical conversion structure so the electron- or hole-blocking layer abuts the exposed surface of the organic photoelectrical conversion structure. In particular, this overlying electron- or hole-blocking layer is deposited by plasma vapor deposition (PVD), and this plasma process can damage the exposed surface of the organic photoelectrical conversion structure, thereby degrading the performance of the CIS.

Therefore, to ward off this potential PVD-damage, some embodiments of the present disclosure include one or more protection layers to help protect the surface of the organic photoelectrical conversion structure from plasma damage. In addition, in some embodiments, one or more protection layers are included to increase the electron- or hole-blocking capability of an electron- or hole-blocking layer between the organic photo active layer and the lower electrode.

Further, the organic photoelectric conversion structure may comprise organic conjugated materials that are easily degraded by reacting with oxygen and moisture. By covering the organic photoelectric conversion structure by these protection layers, reliability of the organic image sensor is improved. Thus, these protection layer(s) can help improve the overall performance, reliability, and/or efficiency of the CIS.

FIG. 1a shows a cross-sectional view of some embodiments of an organic image sensor 100, which includes first and second protection structures 108, 118 that are described in more detail below. The organic image sensor 100 includes an organic photoelectrical conversion structure 120 arranged between a first (lower) electrode 104, and a second (upper) electrode 114. The second electrode 114 is transparent in a predetermined wavelength range so photons 130 having wavelengths falling within a predetermined wavelength range pass through the second electrode 114 to strike to the organic photoelectrical conversion structure 120. For example, the second electrode 114 can be made of a transparent conductive metal oxide such as ITO, FTO, AZO, IGZO, SnO2 and/or ZnO. When incident radiation of sufficient energy passes through the upper electrode 114 and is absorbed by the organic photoelectrical conversion structure 120, an electron-hole pair is created. A voltage is applied across the first and second electrodes 104, 114 so generated holes are accelerated toward one of the electrodes (e.g., towards the lower electrode 104 acting as an anode), while electrons are accelerated toward the other electrode (e.g., towards the upper electrode acting as a cathode). In this way, the incident radiation produces a photocurrent between the electrodes 104, 114, wherein the current level of this photocurrent is proportional to the intensity of the incident radiation absorbed.

First and second charge-blocking layers 106, 116, which block opposite types of charge, separate the organic photoelectrical conversion structure 120 from the first and second electrodes 104, 114, respectively. The second charge blocking structure 116 is transparent in the predetermined wavelength range to allow photons having wavelengths falling within the predetermined wavelength range to strike to the organic photoelectrical conversion structure 120. For example, in embodiments where the first electrode 104 acts as an anode, the first charge-blocking layer 106 is an electron-blocking layer. Similarly, in embodiments where the second electrode 114 acts as a cathode, the second charge-blocking layer 116 is a hole-blocking layer. It will be appreciated that the anode and cathode could be flipped in other embodiments, such that the lower electrode 104 can alternatively act as a cathode while the upper electrode 114 can act as an anode, provided applied biases and polarities of the charge-blocking layers are also flipped.

Whatever the precise arrangement, the electron blocking structure (e.g. 106) comprises material having a higher "lowest unoccupied molecular orbital" (LUMO)/conduction band (CB) energy than a work function of the anode. The electron blocking structure 106 can work as a hole transporting structure as well and the electron blocking structure (e.g., 106) may correspondingly have an electro affinity smaller than a work function of the material of the anode (e.g., first electrode 104) and an ionization potential smaller than the ionization potential of the adjacent organic photoelectrical conversion structure 120. For example, the electron blocking structure may comprise an inorganic material, such as $MoO_3$, NiO, $WO_3$, CuO or $V_2O_5$, for example. Similarly, the hole blocking structure (e.g. 116) comprises material having a lower highest occupied molecular orbital (HOMO)/valence band (VB) energy than a work function of the cathode. The hole blocking structure 106 can work as an electron transporting structure as well and the hole blocking structure (e.g., 116) may correspondingly have an ionization potential large than a work function of the cathode (e.g., second electrode 114) and an electron affinity larger than the electron affinity of the adjacent organic photoelectrical conversion structure 120. For example, the hole blocking structure may comprise an inorganic material, such as LiF, $TiO_2$, ZnO, $Ta_2O_5$ or $ZrO_2$, for example.

A first protective structure 118 is disposed over the organic photoelectrical conversion structure 120. The first protective structure 118 is disposed between the second charge blocking structure 116 and the organic photoelectrical conversion structure 120 and covers a top surface and a sidewall of the organic photoelectrical conversion structure 120. The first protective structure 118 can be formed by ALD. In some embodiments, the first protective structure comprises aluminum oxide ($Al_2O_3$), aluminum nitride (AlN), or silicon oxide ($SiO_2$). The first protective structure 118 has a thickness in a range of from about 5 Å to about 5 nm In some embodiments, the image sensor 100 further comprises a second protective structure 108 disposed between the first electrode 104 and the first charge blocking structure 106. The second protective structure 108 can comprise the same material as or a different material than the first protective structure 118. The second protective structure can enhance electron/hole blocking of the first charge blocking layer 106.

In some embodiments, the organic photoelectric conversion structure 120 is made up of an upper organic charge blocking layer 120a, a lower organic charge blocking layer 120b, and an organic photo active layer 120c. The organic photo active layer 120c may comprise one or more semiconducting, conjugated polymers, alone or in combination with non-conjugated materials. For example, the organic photo active layer 120c may comprise fullerene derivative (e.g. PTB7 and PC71BM). The organic photo active layer 120c may comprise a blend of two or more conjugated polymers or organic molecules with similar or different electron affinities and electronic energy gaps. The organic photo active layer 120c may also comprise a series of hetero-junctions utilizing layers of organic materials or the blends. The upper and/or lower organic charge blocking layers 120a, 120b can manifest as an electron blocking layer (or somewhat analogously as a hole transport layer) made up of Poly(3-hexylthiophene-2,5-diyl) (P3HT), Poly(3,4-ethylenedioxythiophene) Polystyrene sulfonate (PEDOT:PSS) or Poly[2-methoxy-5-(3',7'-dimethyloctyloxy)-1,4-phenylenevinylene] (MDMO-PPV). The upper and/or lower organic charge blocking layers 120a, 120b can also manifest as a hole-blocking layer (or somewhat analogously as an electron transport layer) made up of fullerene derivative and one or more than one n-type conjugated polymer. For example, the organic hole-blocking/electron transport layer can comprise 2,9-dimethyl-4,7-diphenyl-1,10-phenanthroline (BCP), 2,2'-(1,3-Phenylene)bis[5-(4-tert-butylphenyl)-1,3,4-oxadiazole] (OXD-7), Tert-butyl Peroxyisobutyrate (TBPi) or 3-(Biphenyl-4-yl)-5-(4-tert-butylphenyl)-4-phenyl-4H-1,2,4-triazole (TAZ).

Figure 1B:
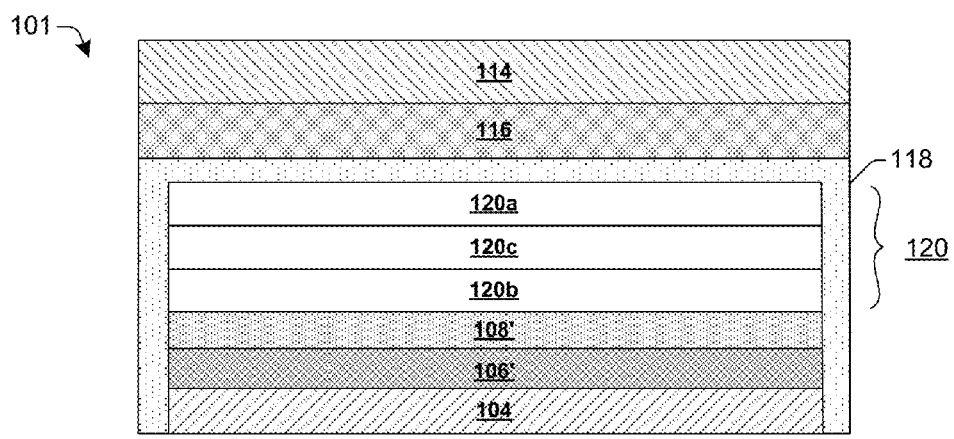
FIG. 1B illustrates a cross-sectional view of some other embodiments of an organic image sensor.

As shown in FIG. 1B, in some other embodiments, the second protective structure 108' can be disposed between the first charge blocking structure 106' and the organic photoelectrical conversion structure 120.

In some embodiments, some of the inorganic blocking structures 106, 116 are formed by physical vapor deposition (PVD) which may introduce plasma damage to the organic photoelectric conversion structure if formed directly onto the organic photoelectric conversion structure. In some embodiments, by forming the protective structure 118 and/or 108 through chemical vapor deposition (CVD) method, in particular atomic layer deposition (ALD), the organic photo electric conversion structure 120 is protected from plasma damage as well as from moisture and other environmental contaminants.

Figure 2:
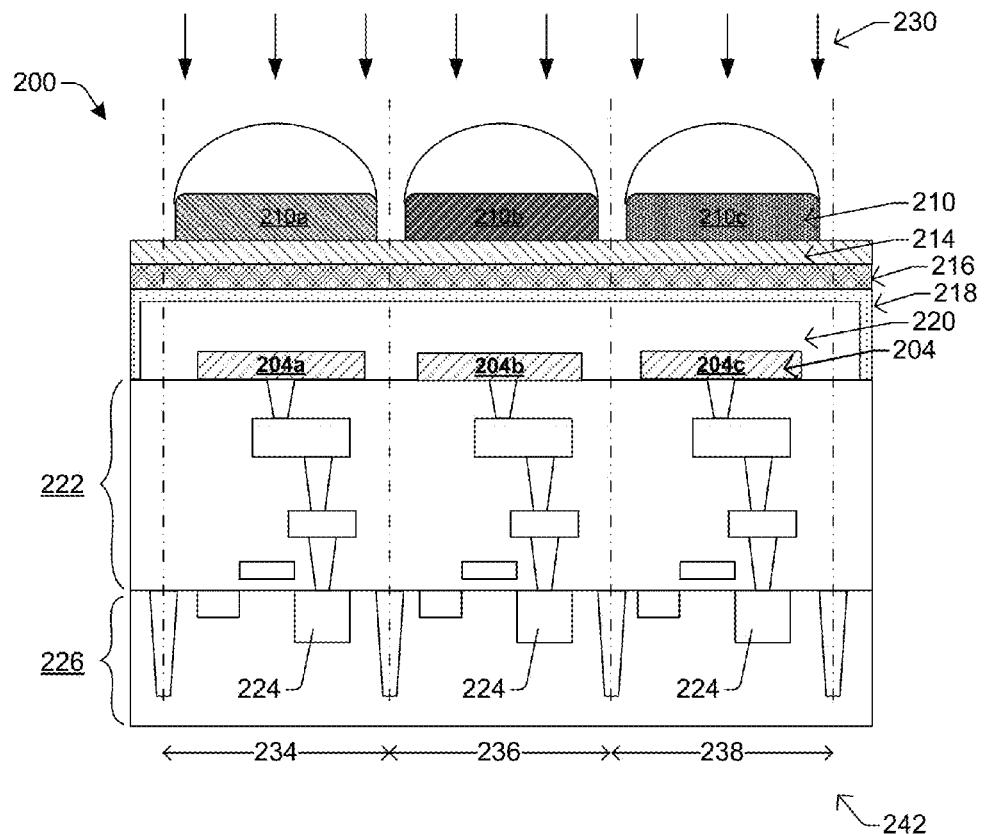
FIG. 2 illustrates a cross-sectional view of some other embodiments of an organic image sensor.
Figure 3:
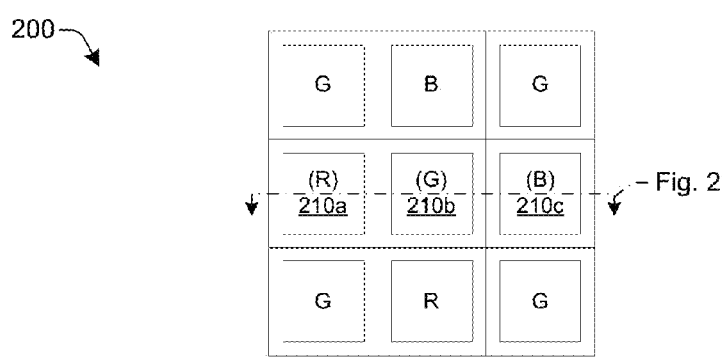
FIG. 3 illustrates a top view of some embodiments of an organic image sensor.

FIG. 2 shows another example of an organic image sensor 200 in accordance with some embodiments. The organic image sensor 200 is made up of a plurality of individual optical sensors 242 (which can also be referred to as "pixels"). For convenience, FIG. 2 illustrates three pixels 234, 236 and 238, which will be described below as a red pixel 234, a green pixel 236, and a blue pixel 238. It will be appreciated that although FIG. 2 illustrates three pixels 234-238, optical sensors in accordance with this disclosure can include any number of pixels, ranging from a single pixel to billions or even more pixels. Further, the pixels are often arranged to follow a predetermined pattern, such as in a Bayer filter for example, where green pixels are arranged to correspond to one half of a checkerboard pattern and where the red and blue collectively establish the other half of the checkerboard pattern. See e.g., FIG. 3. Patterns other than that of a Bayer filter could also be used.

Each pixel 242 includes multiple layers which are stacked on top of one another, and which are formed by photolithography techniques and/or by spin-on coatings, for example. The structure of each pixel 242 is largely the same and repeated. The organic image sensor 200 comprises a first electrode structure 204 (which may also be referred to as a "pixel electrode array" in some embodiments), an organic photoelectric conversion structure 220 disposed over the first electrode array 204, a first protective structure 218 disposed over the organic photoelectric conversion structure 220, a second electrode structure 214 (which may also be referred to as an "upper transparent electrode" in some embodiments) disposed over the first protective structure 218, and a color filter array 210 disposed over the second electrode structure 214. The organic photoelectric conversion structure 220 is configured to convert one or more photons having wavelengths falling with a predetermined wavelength range into an electrical signal.

In some embodiments, the organic photoelectric conversion structure 220 comprises an organic photo active layer, a p type organic hole transport layer and a n type organic electron transport layer. The second electrode structure 214 is transparent in the predetermined range. In some embodiments, the first electrode structure 204 can comprise metal and the second electrode structure 214 can comprise at least one of: ITO, FIO, AZO, or IGZO. One or both of the first and the second electrode structures 204 and 214 are an electrode array having separate components for each pixel 242. The first protective structure 218 is disposed between the organic photoelectric conversion structure 220 and the second electrode structure 214 and covers a top surface and a perimeter of the organic photoelectric conversion structure 220. In some embodiments, the first protective layer 218 covers sidewalls of the organic photoelectric conversion structure 220 to protect the organic photoelectric conversion structure 220 from moisture and oxygen and/or from plasma damage. In some embodiments, the organic image sensor 200 further comprises some inorganic charge blocking structures to suppress the leakage in the dark. For example, an inorganic hole blocking structure 216 can be disposed between the first protective structure 218 and the second electrode structure 214 to prevent a hole from moving from the second electrode structure 214 to the organic photoelectrical conversion structure 220. Although the pixels 242 are similar in many respects, the pixels differ from one another in that the corresponding color filter provides different wavelength specificity. Each color filter of the color filter array 210 passes light of a predetermined frequency range there through, while blocking light of other frequency ranges. For example, the red pixel 234 includes a red color filter 210*a*, which allows red light to pass there through while blocking other wavelengths of light (e.g., red color filter 210*a* blocks blue and green light). The green pixel 236 includes a green color filter 210*b* that allows green light there through while blocking other wavelengths of light (e.g., green color filter 210*b* blocks red and blue light). The blue pixel 238 includes a blue color filter 210*c* that allows blue light to pass there through while blocking other wavelengths of light (e.g., blue color filter 210*c* blocks red and green light).

During operation, polychromatic light approaches the optical sensor 200 as shown by arrow 230, and strikes the upper surfaces of the color filters 210 at a substantially normal angle of incidence, for example. The polychromatic light 230 is filtered to contain only a narrow spectrum of light as it passes through each color filter 210. This filtered light then passes through the upper transparent electrodes 214 and through transparent charge-blocking structure 216 and strikes the photoelectric conversion layers 220. In the photoelectric conversion layer 220, the light is converted from a photon or electromagnetic wave into an electrical signal, such as a voltage or current. The voltage level or current level, which is established between the first and second electrodes 204, 214, corresponds to the intensity of light that strikes the photoelectric conversion layer 220 for a given pixel. This electrical signal is then passed down through interconnect structures 222 to read out circuitry 224 formed in a substrate 226. In some embodiments, the read out circuitry 224 can be a CMOS circuitry. The substrate 226 can be a semiconductor substrate, a plastic substrate or any other suitable substrates. The read out circuitry 224 then uses an algorithm, such as a demosaicing algorithm, to generate a digital image from the electrical signals provided by the array of pixels.

Figure 4:
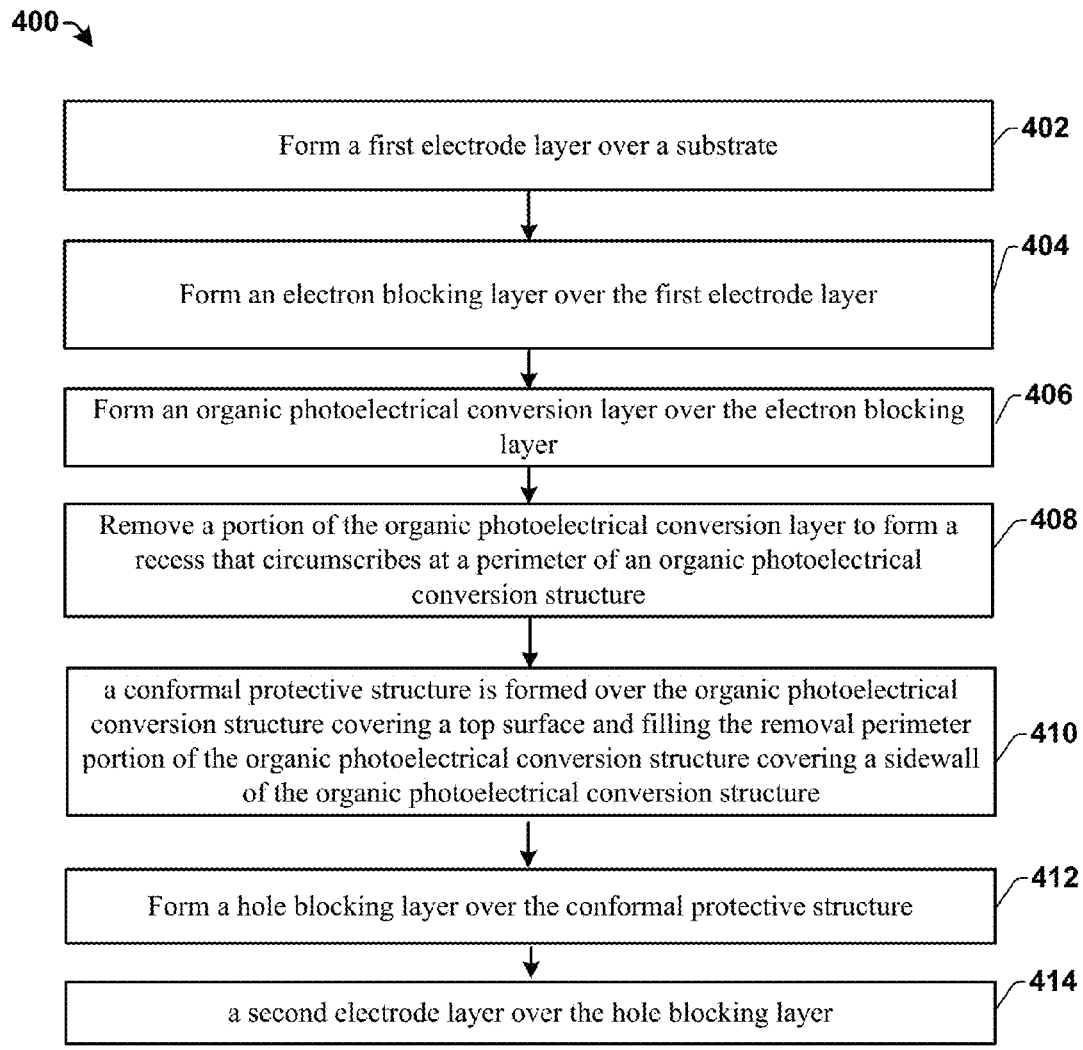
FIG. 4 illustrates a flow diagram of some embodiments of a method of forming an organic image sensor.

FIG. 4 shows a flow diagram of some embodiments of a method 400 of forming an organic image sensor. While disclosed methods (e.g., methods 400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a first electrode layer is formed over a substrate.

At 404, an electron blocking layer is formed over the first electrode layer.

At 406, an organic photoelectrical conversion layer is formed over the electron blocking layer.

At 408, a portion of the organic photoelectrical conversion layer is removed to form a recess that circumscribes at a perimeter of an organic photoelectrical conversion structure.

At 410, a conformal protective structure is formed over the organic photoelectrical conversion structure covering a top surface and filling the removal perimeter portion of the organic photoelectrical conversion structure covering a sidewall of the organic photoelectrical conversion structure.

At 412, a hole blocking layer is formed over the conformal protective structure. In some embodiments, the hole-blocking layer is formed by PVD, and the protection layer formed in 410 protects the organic photoelectrical conversion structure from this PVD process.

At 414, a second electrode layer is formed over the hole blocking layer.

FIGS. 5a-5h show some embodiments of cross-sectional views of protection barrier structure showing a method of forming protection barrier for an integrated microsystem.

Although FIGS. 5a-5h are described in relation to method 400, it will be appreciated that the structures disclosed in FIGS. 5a-5h are not limited to such a method.

Figure 5A:
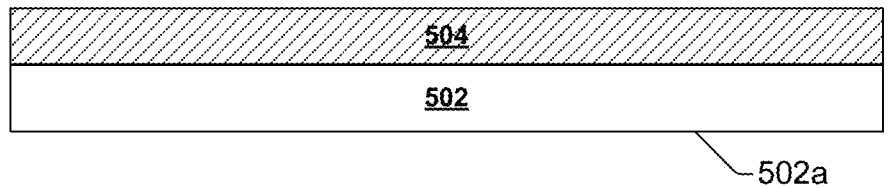
FIGS. 5A-F illustrate some embodiments of cross-sectional views of a method of forming an organic image sensor.

As shown in FIG. 5a, a first electrode layer 504 is formed over a substrate 502. For example, the substrate 502 can be a semiconductor substrate, for example, silicon, or a plastic substrate and the first electrode layer 504 can be made of metal, such as silver, gold, aluminum, titanium, copper, platinum, palladium, and/or nickel. The first electrode can also be made of metal nanowire, a carbon nanotubes or a conductive polymer. A surface treatment can be performed and an adhesion assisting layer can be prepared to the substrate 502 to improve the adhesion property of a coating solution. In some embodiments, the substrate 502 is transparent at a predetermined wavelength range, such that light strikes the sensor through the bottom face of the substrate 502a. For example, the substrate 502 can be made of glass or resin. In this alternative case, the first electrode layer 504 can be made of a transparent conductive metal oxide such as ITO, FTO, AZO, IGZO, SnO2 and/or ZnO. A transparent substrate, if present, is not particularly limited and known materials having any shape, structure, thickness and the like can be used. The first electrode 504 has a thickness in a range of from about 50 nm to about 200 nm.

Figure 5B:
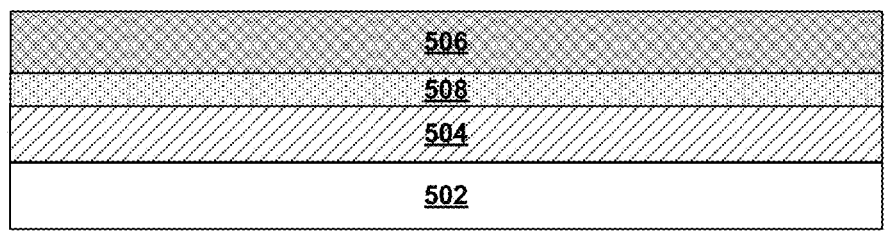

As shown in FIG. 5b, an electron blocking layer 506 is formed over the first electrode layer 504. In some embodiments, a second protective layer 508 can be formed between the first electrode layer 504 and the electron blocking layer 506. The electron blocking layer 506 can comprise PEDOT:PSS, high K ($MoO_3$, NiO, CuO, $WO_3$, $V_2O_5$). The electron blocking layer 506 can have a thickness in a range of from about 5 nm to about 20 nm. The second protective layer 508 can have a bandgap larger than 3 eV. The second protective layer 508 can comprise $Al_2O_3$, AlN, or $SiO_2$. The second protective layer 508 can have a thickness in a range of from about 0.5 nm to about 10 nm.

Figure 5C:
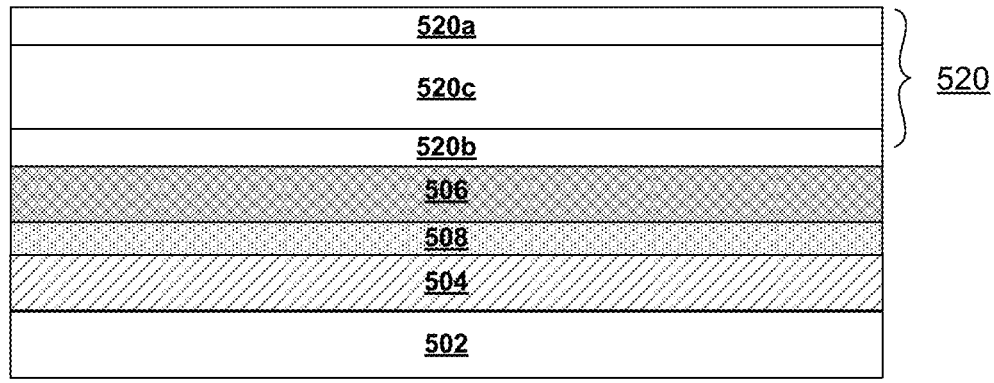

As shown in FIG. 5c, an organic photoelectrical conversion layer 520 is formed over the electron blocking layer 506. In general, the organic photoelectric conversion layer 502 comprises a p-type layer and an n-type layer. In some embodiments, the p-type layer directly abuts the n-type layer to form a p-n junction, but in other embodiments an intrinsic layer is arranged between the p- and n-type layers to form a PIN junction. The p-type layer helps hole transport and can comprise P3HT, MDMO-PPV or other applicable material having a thickness in a range of from about 5 nm to about 20 nm. The n-type layer helps electron transport and can comprise fullerene derivative and one or more conjugated polymers having a thickness in a range of from about 5 nm to about 20 nm. The organic photoelectrical conversion layer 520 can further comprise an active layer comprising conjugated polymers and fullerene derivatives (e.g. PTB7 and PC71BM). The organic photoelectrical conversion layer 520 can have a thickness in a range of from about 100 nm to about 500 nm.

Figure 5D:
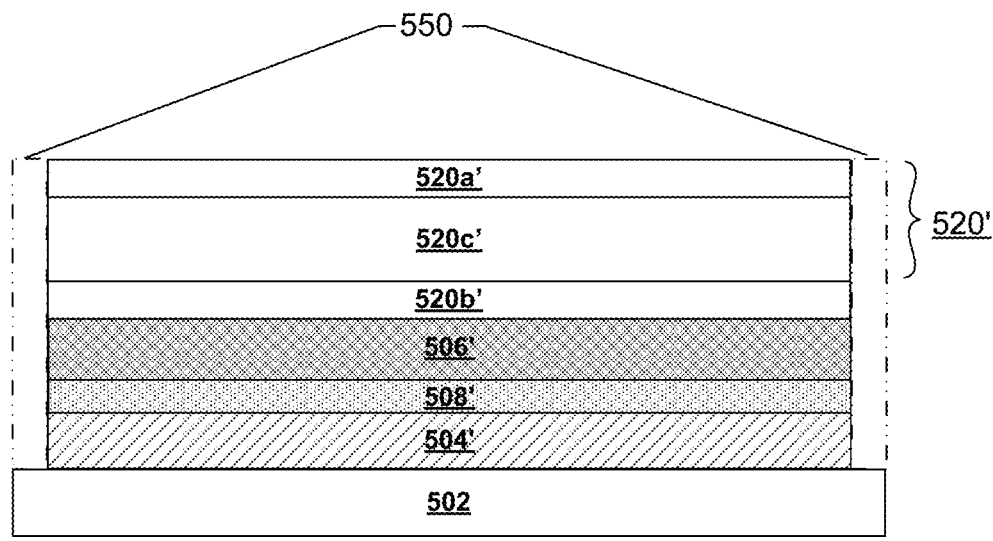

As shown in FIG. 5d, a portion of the organic photoelectrical conversion layer 520 is removed to form a recess 550 that circumscribes at a perimeter of an organic photoelectrical conversion structure 520'.

Figure 5E:
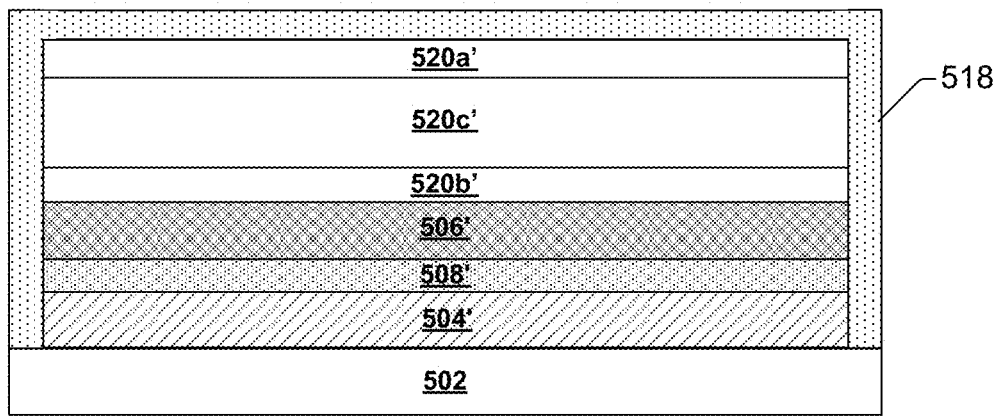

As shown in FIG. 5e, a conformal protective structure 518 is formed over the organic photoelectrical conversion structure 520' covering a top surface and filling the removal perimeter portion 550 of the organic photoelectrical conversion structure 520' covering a sidewall of the organic photoelectrical conversion structure 520'. The conformal protective structure 518 is formed by ALD at a relative low temperature. The conformal protective structure 518 can have a bandgap larger than 3 eV. The conformal protective structure 518 can comprise $Al_2O_3$, AlN, or $SiO_2$. The conformal protective structure 518 can have a thickness in a range of from about 0.5 nm to about 10 nm. The conformal protective structure 518 can be made of same or different material with the second protective structure 508.

Figure 5F:
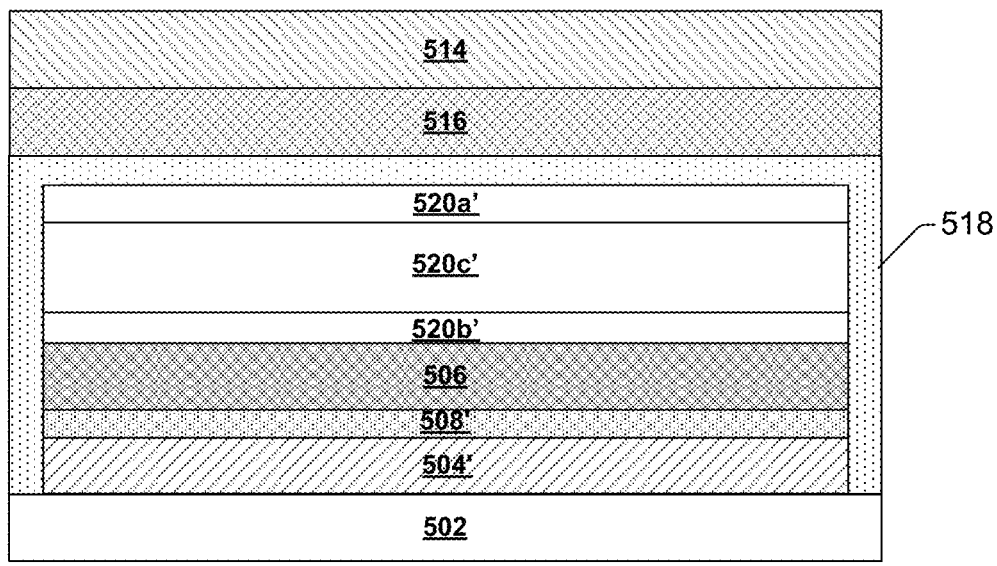

As shown in FIG. 5f, a hole blocking structure 516 is formed over the conformal protective structure 518. A second electrode structure 514 is formed over the hole blocking layer 516. The hole blocking layer 516 can comprise LiF, $TiO_2$, ZnO, $Ta_2O_5$ or $ZrO_2$. The hole blocking layer 516 can have a thickness in a range of from about 5 nm to about 20 nm. The second electrode structure 514 can be made of a transparent conductive metal oxide, metal bulk, metal nanowire, a carbon nanotubes or a conductive polymer. Notably, The first and second electrode structures 504 and 514 work as a cathode and an anode can be switchable along with the electron blocking structure 506' and the hole blocking structure 516, according to the device structure. The thin film protective structures 508 and 518 fabricated by CVD can be disposed covering surfaces of the organic photoelectrical conversion structure 520' to help suppress the dark current and decrease damage introduced by the following processes.

In some embodiments, the present disclosure relates to an organic image sensor. The organic image sensor comprises an organic photoelectrical conversion structure arranged between a first electrode and a second electrode, and configured to convert photons into an electrical signal. The organic image sensor further comprises a first charge blocking structure arranged between the first electrode and the organic photoelectrical conversion structure and configured to block a first kind of electric charge. The organic image sensor further comprises a second charge blocking structure arranged between the organic photoelectrical conversion structure and the second electrode and configured to block a second kind of electric charge. The organic image sensor further comprises a first protective structure arranged between the second charge blocking structure and the organic photoelectrical conversion structure.

In other embodiments, the present disclosure relates to an organic image sensor. The organic image sensor comprises an organic photoelectrical conversion structure configured to convert photons having wavelengths falling within a predetermined range into an electrical signal. The organic image sensor further comprises an upper electrode disposed over the organic photoelectrical conversion structure, wherein the upper electrode is transparent to the photons have wavelengths falling within a predetermined range. The organic image sensor further comprises a first protective structure disposed between the upper electrode and the organic photoelectrical conversion structure.

In yet other embodiments, the present disclosure relates to a method of forming an organic image sensor. The method comprises forming a first electrode layer over a substrate, and forming an organic photoelectrical conversion structure over the first electrode layer. The method further comprises forming a protective structure covering a top surface of the organic photoelectrical conversion structure using an atomic layer deposition process. The method further comprises forming a first charge blocking layer configured to block a first type of charge over the protective structure, and forming a second electrode layer over the first charge blocking layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An organic image sensor, comprising:
    an organic photoelectrical conversion structure arranged between a first electrode and a second electrode, and configured to convert photons into an electrical signal;
    a first charge blocking structure arranged between the first electrode and the organic photoelectrical conversion structure and configured to block a first kind of electric charge;
    a second charge blocking structure arranged between the organic photoelectrical conversion structure and the second electrode and configured to block a second kind of electric charge; and
    a first protective structure arranged between the second charge blocking structure and the organic photoelectrical conversion structure.

2. The organic image sensor of claim 1, wherein the first protective structure extends along sidewalls of the organic photoelectrical conversion structure.

3. The organic image sensor of claim 1, further comprising:
    a second protective structure arranged between the second charge blocking structure and the organic photoelectrical conversion structure.

4. The organic image sensor of claim 3, wherein the second protective structure is a same material with the first protective structure.

5. The organic image sensor of claim 1, wherein sidewalls of the first electrode are laterally offset from sidewalls of the second electrode.

6. The organic image sensor of claim 1, further comprising:
    a plurality of interconnect structures, wherein the first electrode is positioned between the organic photoelectrical conversion structure and the plurality of interconnect structures.

7. The organic image sensor of claim 1, wherein the photons have wavelengths falling within a predetermined range, and wherein the second electrode is transparent to the photons have wavelengths falling within a predetermined range.

8. The organic image sensor of claim 1, wherein the first protective structure comprises aluminum oxide ($Al_2O_3$), aluminum nitride (AlN), or silicon oxide ($SiO_2$).

9. The organic image sensor of claim 1, wherein the second charge blocking structure is configured to block holes.

10. The organic image sensor of claim 1, wherein the first charge blocking structure is configured to block electrons.

11. An organic image sensor, comprising:
    an organic photoelectrical conversion structure configured to convert photons having wavelengths falling within a predetermined range into an electrical signal;
    an upper electrode disposed over the organic photoelectrical conversion structure, wherein the upper electrode is transparent to the photons have wavelengths falling within a predetermined range;
    a first charge-blocking structure arranged between the upper electrode and the organic photoelectrical conversion structure and configured to block a first kind of electric charge; and
    a first protective structure disposed between the first charge-blocking structure and the organic photoelectrical conversion structure.

12. The organic image sensor of claim 11, wherein the organic photoelectrical conversion structure comprises an organic photo active layer, an organic hole transport layer, and an organic electron transport layer.

13. The organic image sensor of claim 11, wherein the first protective structure covers a top surface and sidewalls of the organic photoelectrical conversion structure.

14. The organic image sensor of claim 11, further comprising:
    a lower electrode arranged between the organic photoelectrical conversion structure and a substrate; and
    a second protective structure arranged between the lower electrode and the organic photoelectrical conversion structure and comprising a same material as the first protective structure.

15. The organic image sensor of claim 14, further comprising:
    a hole blocking structure disposed between the first protective structure and the organic photoelectrical conversion structure and configured to block holes; and
    an electron blocking structure disposed between the lower electrode and the organic photoelectrical conversion structure and configured to block electrons.

16. A method of forming an organic image sensor, comprising:
    forming a first electrode layer over a substrate;
    forming an organic photoelectrical conversion structure over the first electrode layer;
    forming a protective structure covering a top surface of the organic photoelectrical conversion structure using an atomic layer deposition process;
    forming a first charge blocking layer configured to block a first type of charge over the protective structure; and
    forming a second electrode layer over the first charge blocking layer.

17. The method of claim 16, further comprising:
    forming a second charge blocking layer configured to block a second type of charge over the first electrode layer, wherein the second charge blocking layer is formed prior to forming the organic photoelectrical conversion structure.

18. The method of claim 16, further comprising:
forming the protective structure to cover sidewalls of the organic photoelectrical conversion structure.

19. The method of claim 16, further comprising:
forming an organic photoelectrical conversion layer over the first electrode layer;
removing a portion of the organic photoelectrical conversion layer to form a recess that circumscribes at a perimeter of the organic photoelectrical conversion structure; and
forming the protective structure to fill the removed portion of the organic photoelectrical conversion structure.

20. The method of claim 16,
wherein the organic photoelectrical conversion structure is configured to convert photons having wavelengths falling within a predetermined range into an electrical signal; and
wherein the second electrode layer is transparent to the photons having wavelengths falling within the predetermined range.

* * * * *